US010888007B1

(12) United States Patent
Bahl

(10) Patent No.: US 10,888,007 B1
(45) Date of Patent: Jan. 5, 2021

(54) MULTI-GANG ELECTRICAL BOX FOR NEW BUILDING CONSTRUCTION AND ASSOCIATED METHODS

(71) Applicant: Michael Vernon Bahl, Hilliard, FL (US)

(72) Inventor: Michael Vernon Bahl, Hilliard, FL (US)

( * ) Notice: Subject to any disclaimer, the term of this patent is extended or adjusted under 35 U.S.C. 154(b) by 0 days.

(21) Appl. No.: 16/740,579

(22) Filed: Jan. 13, 2020

(51) Int. Cl.
*H05K 5/02* (2006.01)
*H02G 3/08* (2006.01)
*H02G 3/10* (2006.01)
*H05K 5/03* (2006.01)

(52) U.S. Cl.
CPC ............ *H05K 5/0247* (2013.01); *H02G 3/081* (2013.01); *H02G 3/10* (2013.01); *H05K 5/0217* (2013.01)

(58) Field of Classification Search
CPC ...... H05K 5/0247; H05K 5/0217; H02G 3/08; H02G 3/081; H02G 3/083; H02G 3/10; H02G 3/12; H02G 3/121; H02G 3/123; H02G 3/14
See application file for complete search history.

(56) References Cited

U.S. PATENT DOCUMENTS

| | | | | |
|---|---|---|---|---|
| 3,892,911 A * | 7/1975 | Codrino | .................. | H02G 3/16 174/59 |
| 6,395,981 B1* | 5/2002 | Ford | ..................... | H02G 3/086 174/499 |
| 9,788,374 B1* | 10/2017 | Holleschau | ........... | H05B 45/37 |
| 10,278,301 B2 | 4/2019 | Bahl | | |
| 2002/0117317 A1* | 8/2002 | Archer | .................. | H02G 3/086 174/50 |
| 2004/0045960 A1* | 3/2004 | Rose | ..................... | H02G 3/083 220/3.9 |
| 2018/0235095 A1* | 8/2018 | Bahl | ..................... | H02G 3/081 |
| 2019/0305537 A1* | 10/2019 | Liubakka | ............ | H02G 3/0456 |
| 2019/0305540 A1* | 10/2019 | Liubakka | ................. | H02G 3/10 |
| 2020/0006928 A1* | 1/2020 | Crabb | ................. | H01R 13/514 |
| 2020/0144800 A1* | 5/2020 | Liubakka | ............ | H02G 3/0481 |

* cited by examiner

*Primary Examiner* — Timothy J Thompson
*Assistant Examiner* — Amol H Patel
(74) *Attorney, Agent, or Firm* — Ashkan Najafi

(57) ABSTRACT

A multi-gang electrical box includes an electrical enclosure defining opposed side walls, a lower wall, an upper wall, and a rear wall. The rear wall has a perimeter adjoining the side walls, the lower wall, and the upper wall to form a cavity. The electrical enclosure has a centrally registered longitudinal axis traversing the lower wall and the upper wall. A complementary cover assembly is configured to removably affix to an opening of the cavity of the electrical enclosure. A plurality of linear grooves disposed along an interior surface of the opposed sidewalls, respectively, and spaced from the lower wall and the upper wall. A plurality of chamfered channels are disposed at the rear wall for receiving electrical wires therethrough. Each of the upper wall and the rear wall has a corresponding smooth, planar, and uninterrupted inner surface, respectively.

20 Claims, 6 Drawing Sheets

MULTI-GANG ELECTRICAL BOX FOR NEW BUILDING CONSTRUCTION AND ASSOCIATED METHODS

CROSS REFERENCE TO RELATED APPLICATIONS

Not applicable.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND

Technical Field

Exemplary embodiment(s) of the present disclosure relate to multi-gang electrical boxes and, more particularly, to a multi-gang electrical box for use in new building construction and configured to receive a plurality of electrical devices and wirings. The present disclosure is an improvement to the multi-gang electrical box disclosed in U.S. Pat. No. 10,278,301, filed by and owned by the present applicant.

Prior Art

In new building construction, electrical enclosures, frames, housings, boxes or the like are quite common and are extensively used to support fixtures to which high and low voltage wires are terminated, to prevent electrical shocks to equipment users and to prevent fixtures from the environment. Examples of such fixtures are switches, duplex receptacles, Ground Fault Circuit Interrupters, telephone jacks, cable connections, switches, knobs, displays and other power or communication devices. Such enclosures supporting these fixtures requires support within the building structure if they are to be installed in accordance with local or national industry codes.

In new building construction, electrical outlets are installed by cutting a hole in the drywall at a size of the box to be installed on the wall. After cutting the hole in the drywall, the electrical box is positioned inside the hole and wirings of the electrical device is accomplished. Most houses and condos are built with standard size electrical boxes. Today with the ever-increasing demand for all new innovative devices desired with remodels and upgrades to existing homes, electrical housings need more accommodated space. For example, the modern decora light dimming switch or decora duplex receptacle or decora duplex I receptacle with USB charging capabilities uses twice the space in an electrical box as its former counterpart. Trying to install new or more wires into an already existing electrical box, always result in improper fit of device or congested wire arrangement or even sometimes leads to breakage of components installed in the electrical box, given the desperate lack of space.

Accordingly, a need remains for multi-gang electrical box in order to overcome at least one aforementioned shortcoming. The exemplary embodiment(s) satisfy such a need by providing a multi-gang electrical box for use in new building construction. that is convenient and easy to use, lightweight yet durable in design, versatile in its applications, and configured to receive a plurality of electrical devices and wirings. The present disclosure is an improvement to the multi-gang electrical box disclosed in U.S. Pat. No. 10,278,301, filed by and owned by the present applicant.

BRIEF SUMMARY OF NON-LIMITING EXEMPLARY EMBODIMENT(S) OF THE PRESENT DISCLOSURE

In view of the foregoing background, it is therefore an object of the non-limiting exemplary embodiment(s) to provide a multi-gang electrical box for use in new building construction and configured to receive a plurality of electrical devices and wirings. The present disclosure is an improvement to the multi-gang electrical box disclosed in U.S. Pat. No. 10,278,301, filed by and owned by the present applicant. These and other objects, features, and advantages of the non-limiting exemplary embodiment(s) are provided by a multi-gang electrical box for use in new building construction and configured to receive a plurality of electrical devices and wirings.

Such a multi-gang electrical box includes an electrical enclosure defining opposed side walls, a lower wall, an upper wall, and a rear wall. The rear wall has a perimeter adjoining the side walls, the lower wall, and the upper wall to form a cavity. The electrical enclosure has a centrally registered longitudinal axis traversing the lower wall and the upper wall. A complementary cover assembly is configured to removably affix to an opening of the cavity of the electrical enclosure. Advantageously, a plurality of linear grooves disposed along an interior surface of the opposed sidewalls, respectively, and spaced from the lower wall and the upper wall. A plurality of chamfered channels are disposed at the rear wall for receiving electrical wires therethrough. Advantageously, each of the upper wall and the rear wall has a corresponding smooth, planar, and uninterrupted inner surface, respectively. Such a structural configuration provides the new, useful, and unexpected result of removing the need for dividers in the multi-gang electrical box during installation in new building construction.

In a non-limiting exemplary embodiment, the linear grooves are juxtaposed side-by-side in a parallel configuration. Advantageously, the linear grooves are suitably sized and shaped for receiving a fastener therethrough for attaching the electrical enclosure to a wall stud at a new building construction. In this manner, the linear grooves are registered orthogonal to the centrally registered longitudinal axis. Such a structural configuration provides the new, useful, and unexpected result of enabling a user to directly affix the multi-gang electrical box to wall studs by penetrating screws (fasteners) directly through the linear grooves and into the wall studs in new building construction while satisfying new building construction codes.

In a non-limiting exemplary embodiment, the chamfered channels include a plurality of paired chamfered channels extended through the rear wall and linearly juxtaposed between the opposed side walls. Such a structural configuration provides the new, useful, and unexpected result of more efficiently guiding electrical wires into and out of the electrical enclosure per new building construction codes.

In a non-limiting exemplary embodiment, the electrical enclosure further includes a plurality of first guide rails statically disposed along the opposed side walls and equidistantly offset from the centrally registered longitudinal axis. Such first guide rails are extended inwardly towards the centrally registered longitudinal axis and registered orthogonal thereto. Such a structural configuration provides the new, useful, and unexpected result of easily aligning, attaching and detaching the complementary cover to the electrical enclosure during new building construction.

In a non-limiting exemplary embodiment, the complementary cover includes an upper surface including opposed lateral edges having a plurality of second guide rails statically disposed thereat and slidably engaged with the first guide rails, respectively, along a linear travel path substantially orthogonal to the centrally registered longitudinal axis. Such an upper surface further has a smooth, planar, and uninterrupted medial section intermediately disposed between the opposed lateral edges. Such a structural configuration provides the new, useful, and unexpected result of easily aligning, attaching and detaching the complementary cover to the electrical enclosure during new building construction.

In a non-limiting exemplary embodiment, the electrical enclosure further includes a plurality of first snap-fit clasps statically affixed to the inner surface of the opposed side walls and registered parallel to the centrally registered longitudinal axis. Advantageously, the first snap-fit clasps are linear. Such a structural configuration provides the new, useful, and unexpected result of easily aligning, attaching and detaching the complementary cover to the electrical enclosure during new building construction.

In a non-limiting exemplary embodiment, the complementary cover further includes a bottom surface including a plurality of second snap-fit clasps frictionally fit with the first snap-fit clasps, respectively, when the complementary cover is installed on the electrical enclosure. Such a structural configuration provides the new, useful, and unexpected result of easily aligning, attaching and detaching the complementary cover to the electrical enclosure during new building construction.

In a non-limiting exemplary embodiment, the electrical enclosure further includes a plurality of slots registered orthogonal to the centrally registered longitudinal axis. The complementary cover further includes a plurality of locking fingers linearly and removably inserted into the slots, respectively. Such a structural configuration provides the new, useful, and unexpected result of easily aligning, attaching and detaching the complementary cover to the electrical enclosure during new building construction.

In a non-limiting exemplary embodiment, the electrical enclosure further includes a first top edge connected to the upper wall and having a plurality of first tabs removably affixed thereto. Each of the first tabs has a corresponding first aperture. Notably, the complementary cover further includes a second top edge connected to the upper surface and having a plurality of second tabs removably affixed thereto. Each of the second tabs has a corresponding second aperture. Advantageously, each of the first tabs and the second tabs has a perforation that is defined along a line of weakness for respectively separating the first tabs and the second tabs from the electrical enclosure and the complementary cover. Such a structural configuration provides the new, useful, and unexpected result of easily aligning, attaching and detaching the complementary cover to the electrical enclosure during new building construction. In addition, unnecessary tabs can be easily removed to allow proper fit of the multi-gang electrical box in space-limited areas defined by wall studs in new building construction.

In a non-limiting exemplary embodiment, each of the cavity of the electrical enclosure is L-shaped. Preferably, the electrical box is a multiple gang electrical box. Such a structural configuration provides the new, useful, and unexpected result of new building construction while fitting in space-limited areas defined by wall studs in new building construction.

There has thus been outlined, rather broadly, the more important features of non-limiting exemplary embodiment(s) of the present disclosure so that the following detailed description may be better understood, and that the present contribution to the relevant art(s) may be better appreciated. There are additional features of the non-limiting exemplary embodiment(s) of the present disclosure that will be described hereinafter and which will form the subject matter of the claims appended hereto.

BRIEF DESCRIPTION OF THE NON-LIMITING EXEMPLARY DRAWINGS

The novel features believed to be characteristic of non-limiting exemplary embodiment(s) of the present disclosure are set forth with particularity in the appended claims. The non-limiting exemplary embodiment(s) of the present disclosure itself, however, both as to its organization and method of operation, together with further objects and advantages thereof, may best be understood by reference to the following description taken in connection with the accompanying drawings in which:

Figure 1:
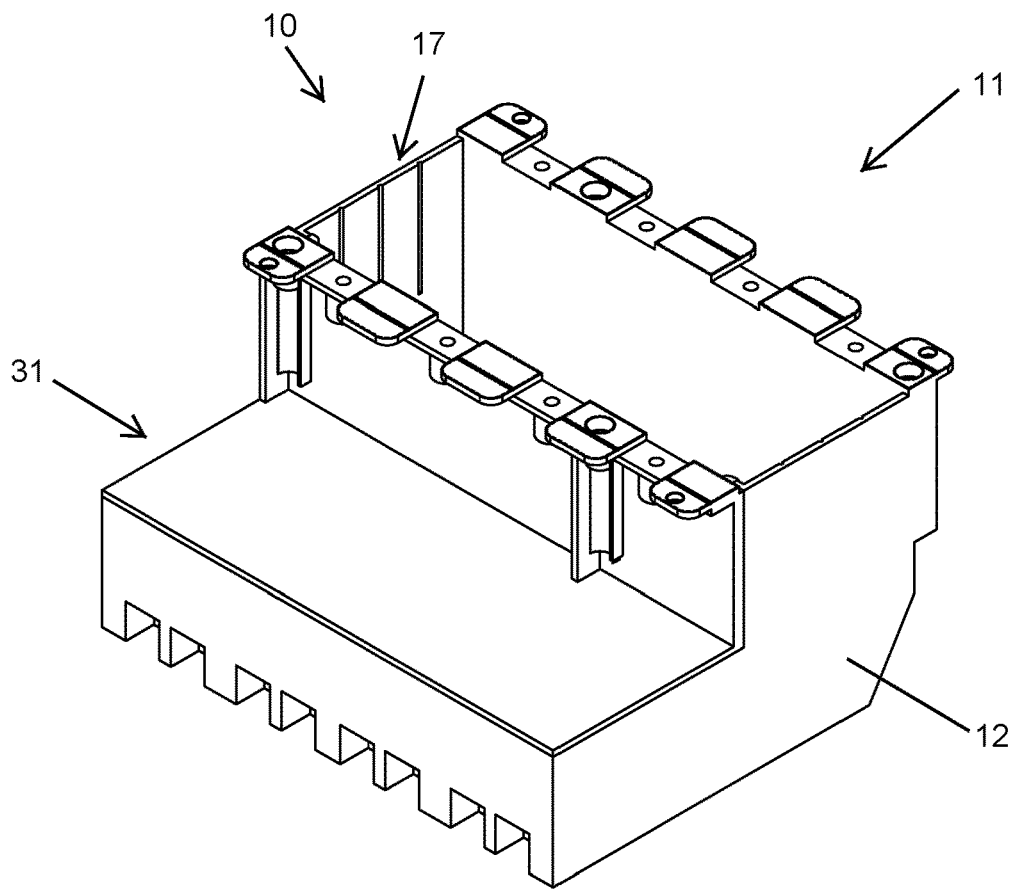
FIG. 1 is a front perspective view of a multi-gang electrical box for use in new building construction, in accordance with a non-limiting exemplary embodiment of the present disclosure.

Those skilled in the art will appreciate that the figures are not intended to be drawn to any particular scale; nor are the figures intended to illustrate every non-limiting exemplary embodiment(s) of the present disclosure. The present disclosure is not limited to any particular non-limiting exemplary embodiment(s) depicted in the figures nor the shapes, relative sizes or proportions shown in the figures.

DETAILED DESCRIPTION OF NON-LIMITING EXEMPLARY EMBODIMENT(S) OF THE PRESENT DISCLOSURE

The present disclosure will now be described more fully hereinafter with reference to the accompanying drawings, in which non-limiting exemplary embodiment(s) of the present disclosure is shown. The present disclosure may, however, be embodied in many different forms and should not be construed as limited to the non-limiting exemplary embodiment(s) set forth herein. Rather, such non-limiting exemplary embodiment(s) are provided so that this application will be thorough and complete, and will fully convey the true spirit and scope of the present disclosure to those skilled in the relevant art(s). Like numbers refer to like elements throughout the figures.

The illustrations of the non-limiting exemplary embodiment(s) described herein are intended to provide a general understanding of the structure of the present disclosure. The illustrations are not intended to serve as a complete description of all of the elements and features of the structures, systems and/or methods described herein. Other non-limiting exemplary embodiment(s) may be apparent to those of ordinary skill in the relevant art(s) upon reviewing the disclosure. Other non-limiting exemplary embodiment(s) may be utilized and derived from the disclosure such that structural, logical substitutions and changes may be made without departing from the true spirit and scope of the present disclosure. Additionally, the illustrations are merely representational are to be regarded as illustrative rather than restrictive.

One or more embodiment(s) of the disclosure may be referred to herein, individually and/or collectively, by the term "non-limiting exemplary embodiment(s)" merely for convenience and without intending to voluntarily limit the true spirit and scope of this application to any particular non-limiting exemplary embodiment(s) or inventive concept. Moreover, although specific embodiment(s) have been illustrated and described herein, it should be appreciated that any subsequent arrangement designed to achieve the same or similar purpose may be substituted for the specific embodiment(s) shown. This disclosure is intended to cover any and all subsequent adaptations or variations of other embodiment(s). Combinations of the above embodiment(s), and other embodiment(s) not specifically described herein, will be apparent to those of skill in the relevant art(s) upon reviewing the description.

References in the specification to "one embodiment(s)", "an embodiment(s)", "a preferred embodiment(s)", "an alternative embodiment(s)" and similar phrases mean that a particular feature, structure, or characteristic described in connection with the embodiment(s) is included in at least an embodiment(s) of the non-limiting exemplary embodiment(s). The appearances of the phrase "non-limiting exemplary embodiment" in various places in the specification are not necessarily all meant to refer to the same embodiment(s).

Directional and/or relationary terms such as, but not limited to, left, right, nadir, apex, top, bottom, vertical, horizontal, back, front and lateral are relative to each other and are dependent on the specific orientation of an applicable element or article, and are used accordingly to aid in the description of the various embodiment(s) and are not necessarily intended to be construed as limiting.

If used herein, "about" means approximately or nearly and in the context of a numerical value or range set forth means±15% of the numerical.

If used herein, "substantially" means largely if not wholly that which is specified but so close that the difference is insignificant.

Figure 2:
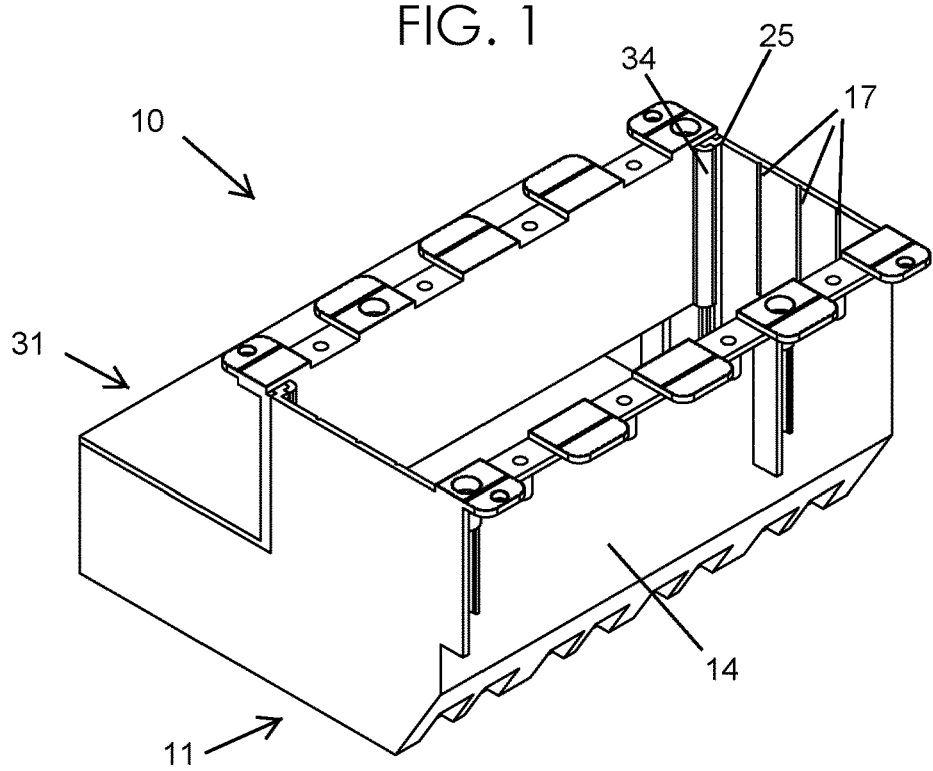
FIG. 2 is a rear perspective view of the multi-gang electrical box shown in FIG. 1.
Figure 3:
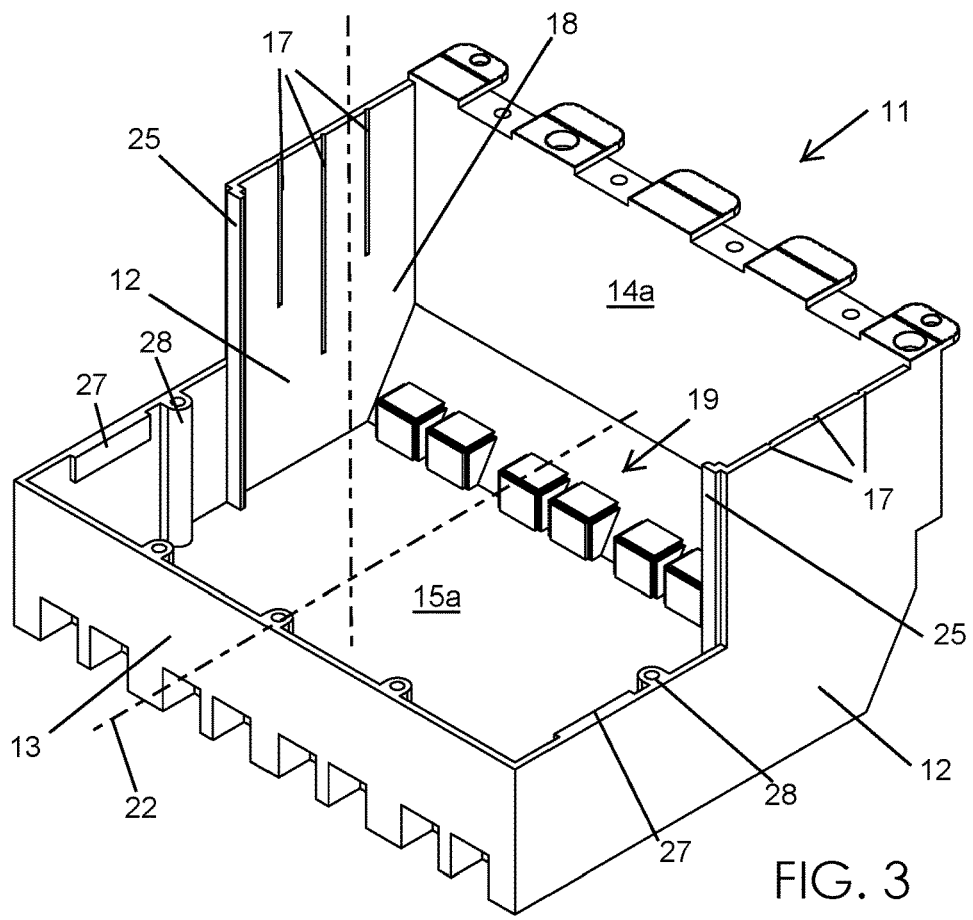
FIG. 3 is a front perspective view of the electrical enclosure shown in FIG. 1.
Figure 4:
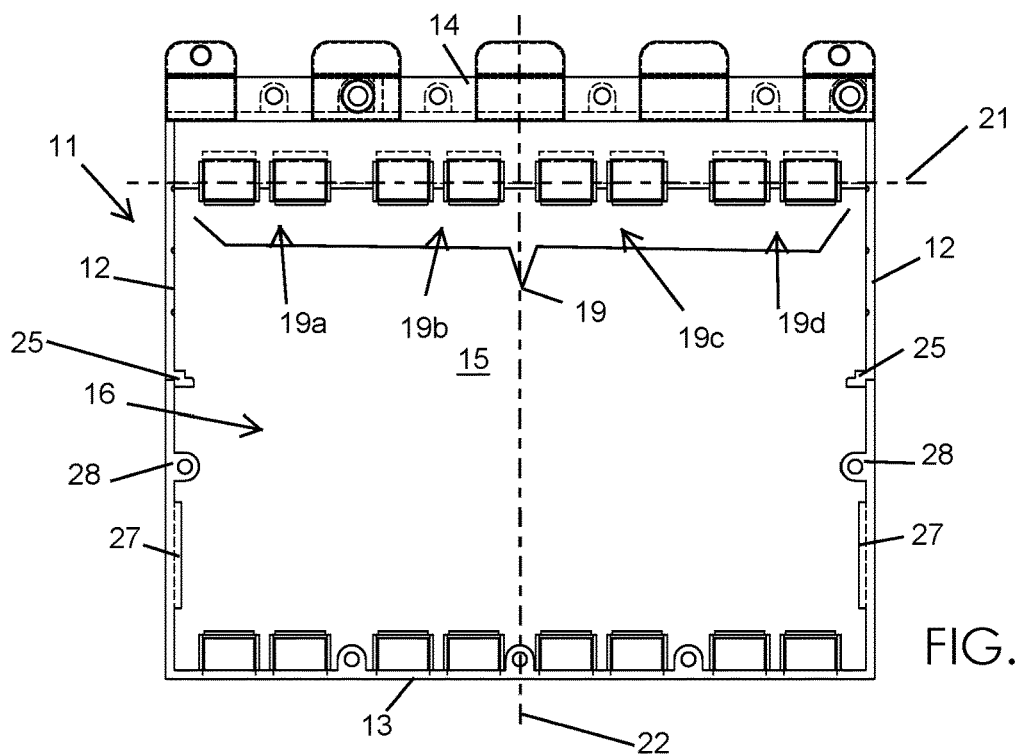
FIG. 4 is a top plan view of the electrical enclosure shown in FIG. 3.
Figure 5:
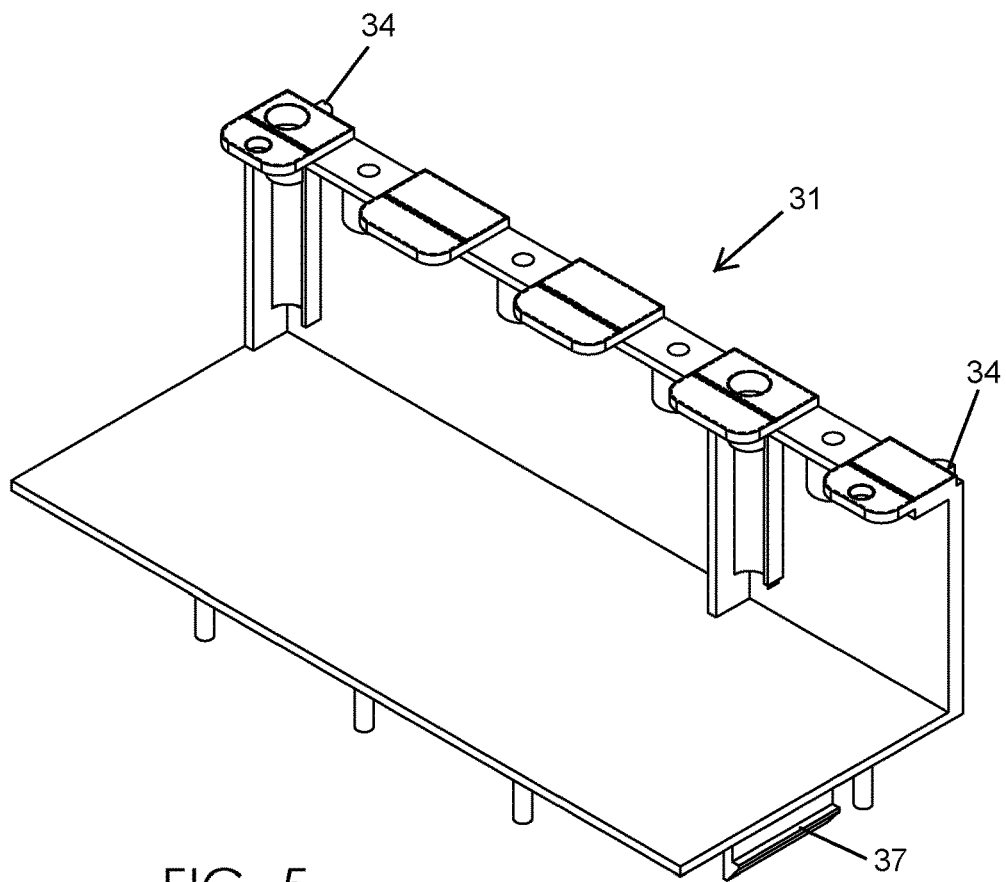
FIG. 5 is a front perspective view of the complementary cover shown in FIG. 1.
Figure 6:
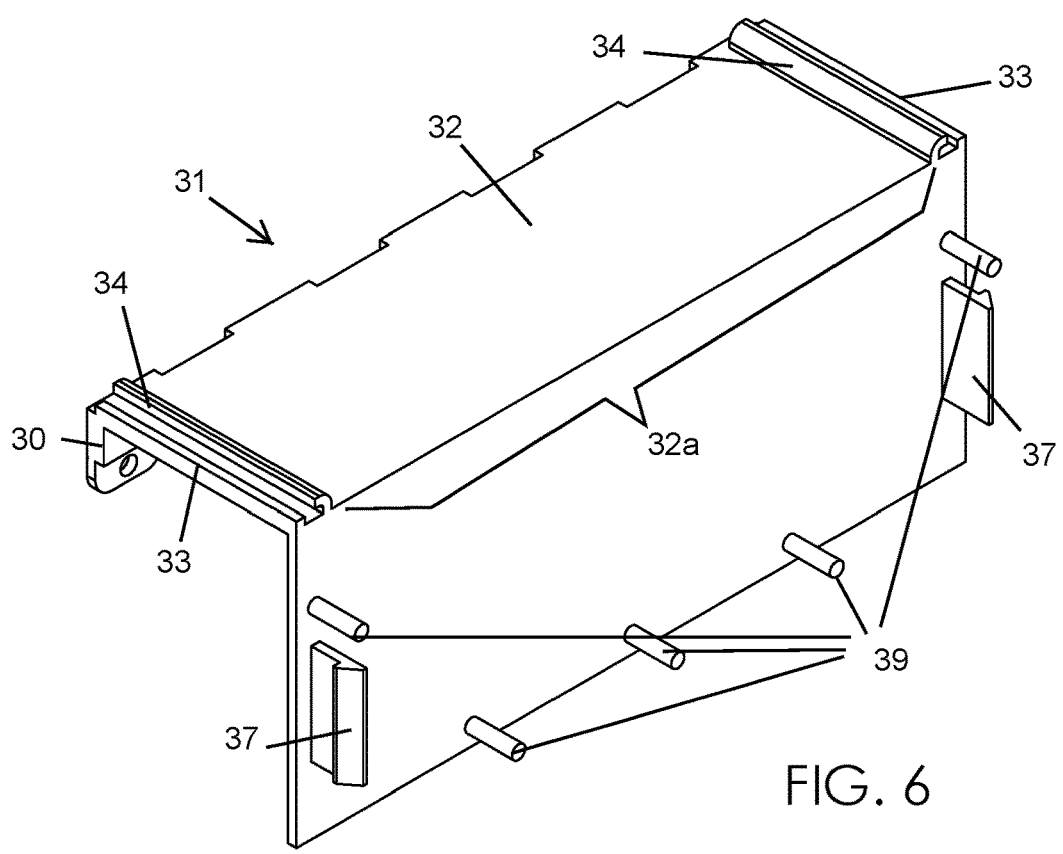
FIG. 6 is a rear perspective view of the complementary cover shown in FIG. 1.
Figure 7:
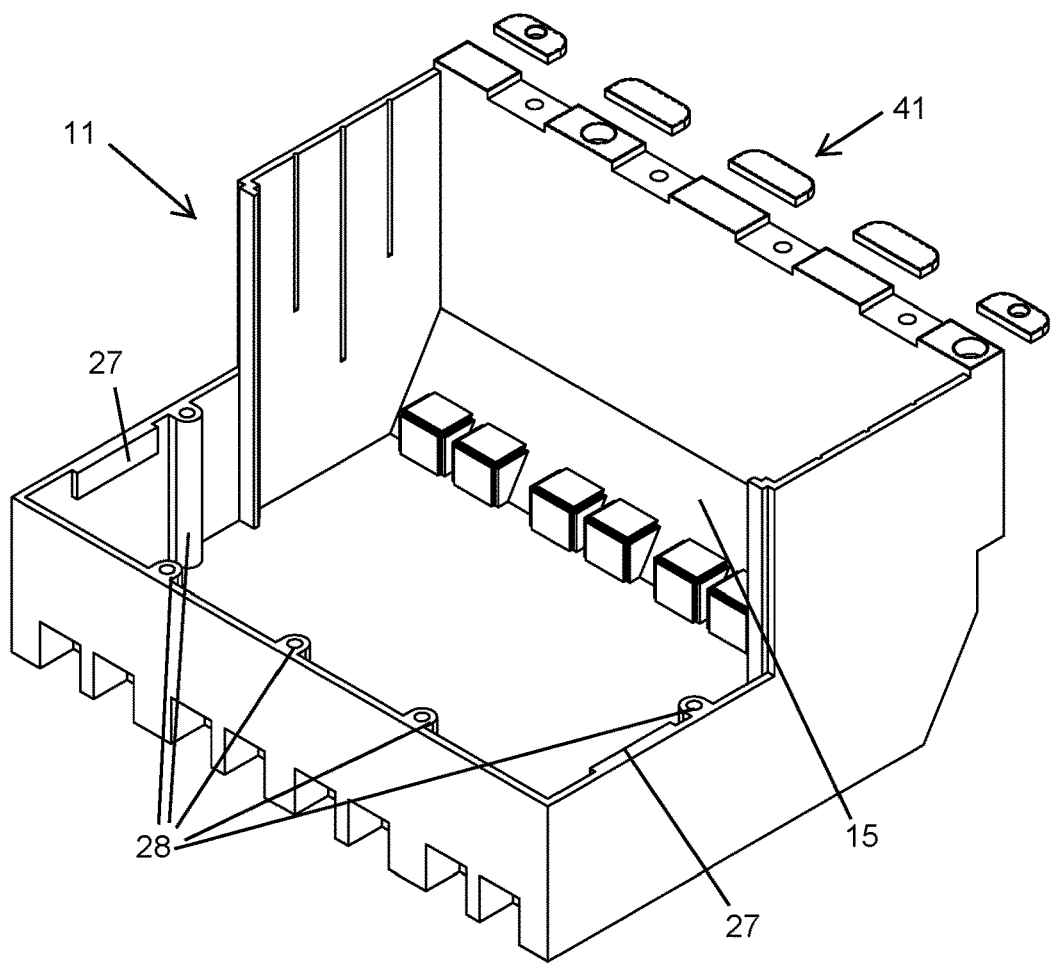
FIG. 7 is an exploded view of the electrical enclosure shown in FIG. 1.
Figure 8:
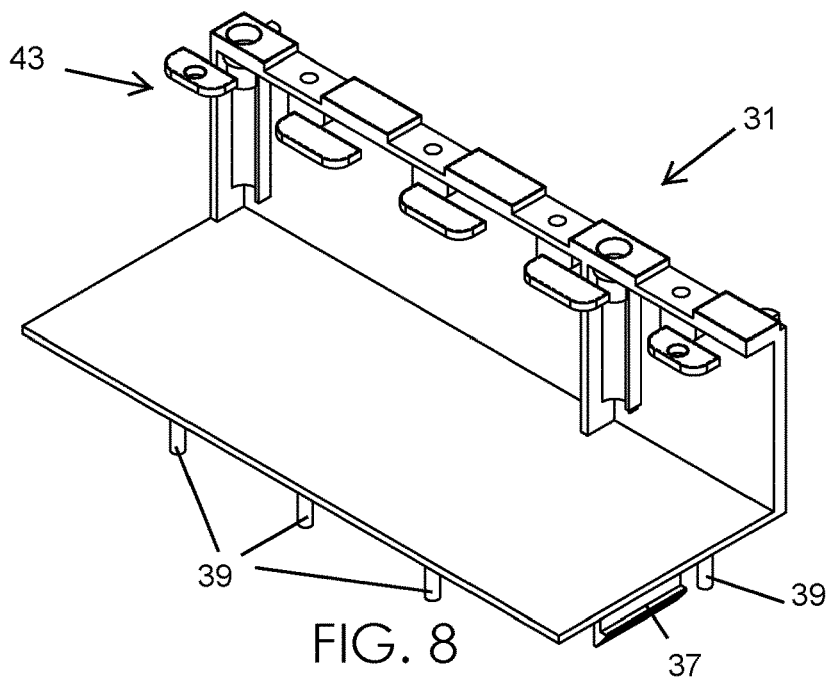
FIG. 8 is an exploded view of the complementary cover shown in FIG. 1.
Figure 9:
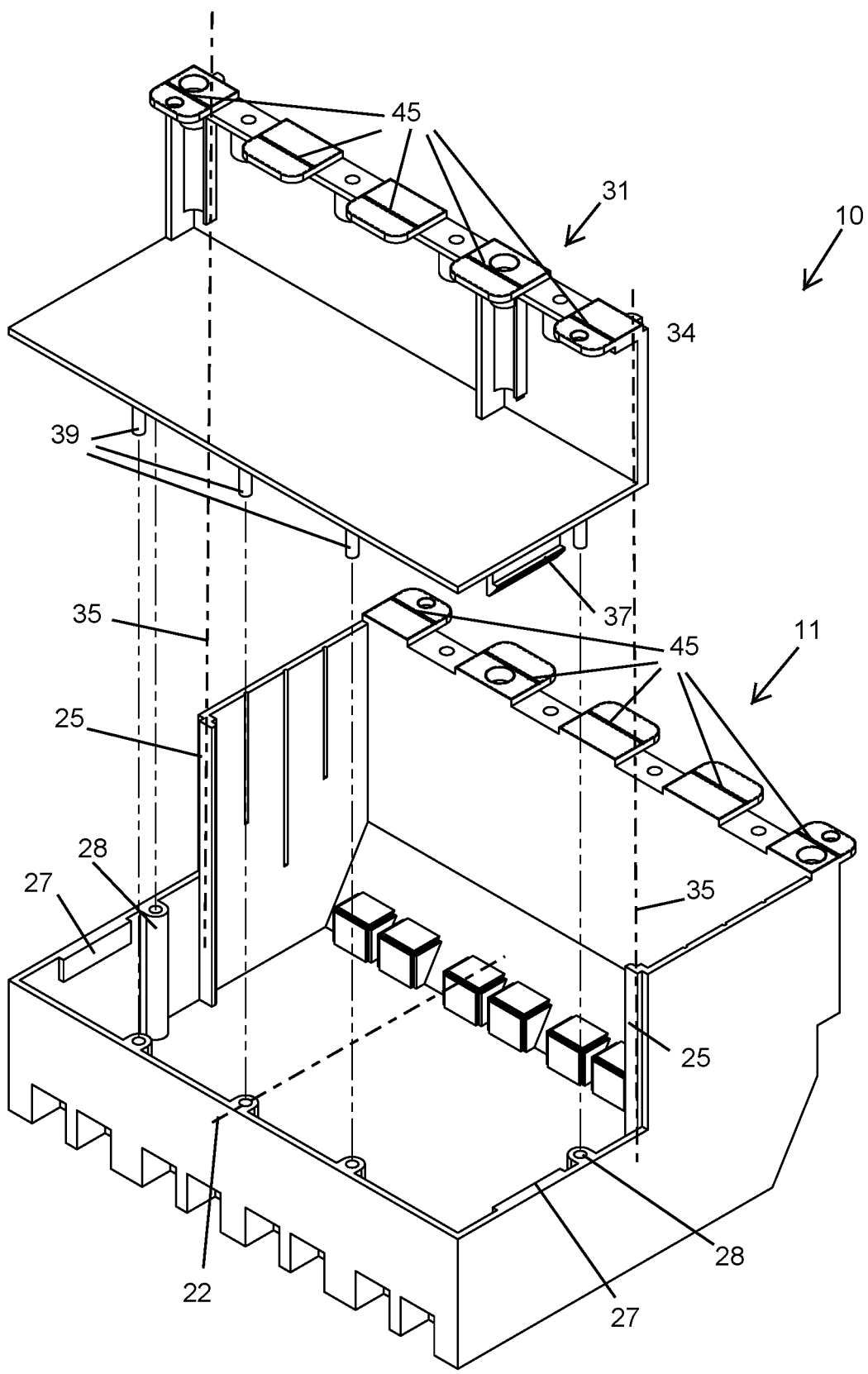
FIG. 9 is an exploded view of the multi-gang enclosure box shown in FIG. 1.
Figure 10:
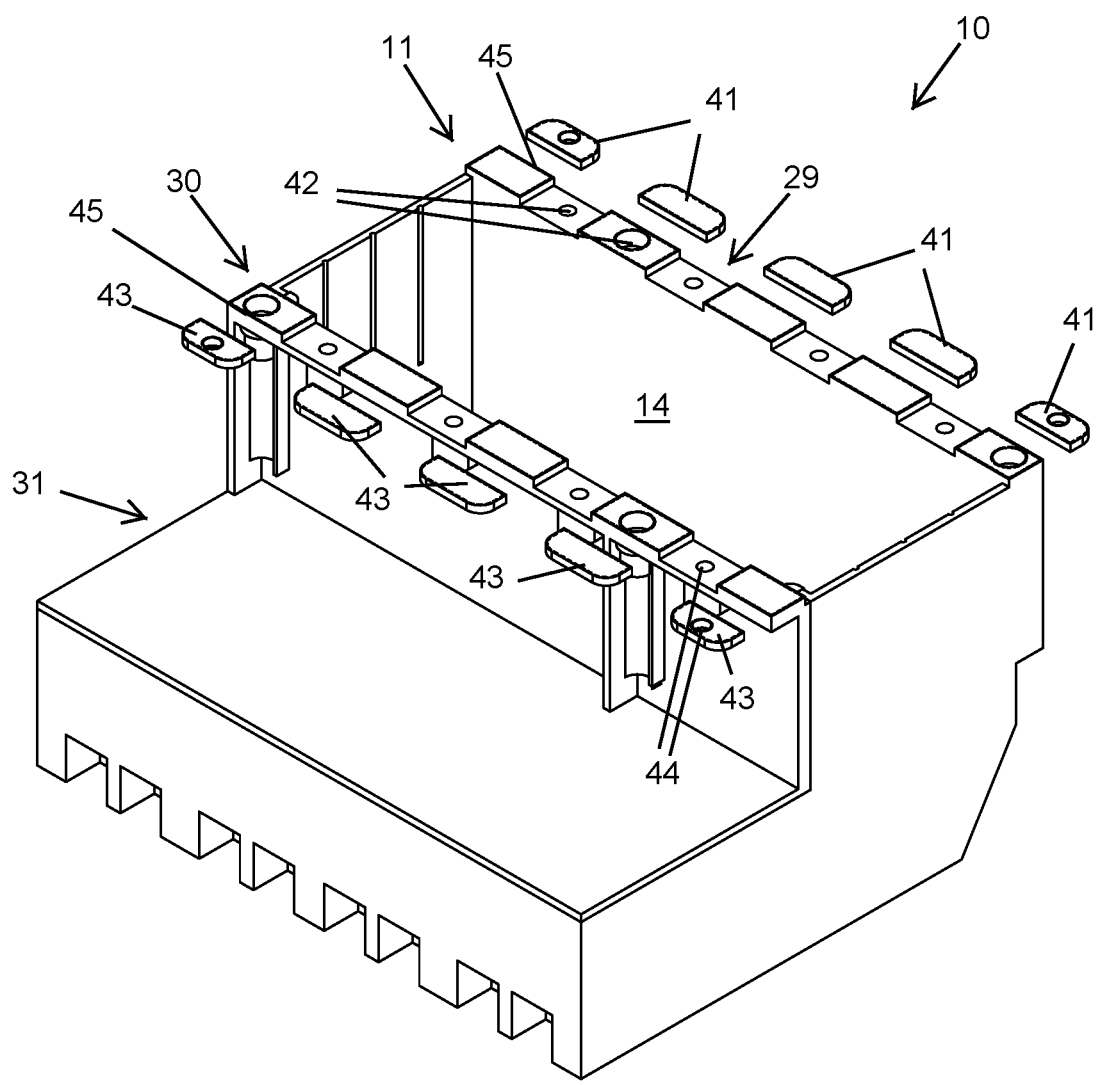
FIG. 10 is a perspective view of the multi-gang enclosure box shown in FIG. 1 wherein the tabs are separated via the perforations (lines of weakness).

The non-limiting exemplary embodiment(s) is/are referred to generally in FIGS. 1-10 and is/are intended to provide a multi-gang electrical box 10 for use in new building construction and configured to receive a plurality of electrical devices and wirings. As an example, the multi-gang electrical box 10 is suitably sized and shaped for receiving an electrical outlet member such as a light switch, a Ground Fault Circuit Interrupter (GFCI), a duplex outlet, or any other suitable electrical device. The multi-gang electrical box 10 of the present disclosure is an improvement to the retrofit multi-gang electrical box disclosed in U.S. Pat. No. 10,278,301, listing the present applicant. Such a prior disclosure requires the use of divider members (formations) located in the electrical enclosure 11 and at the complementary cover 31 for supporting GFCIs when installing the retrofit multi-gang electrical box in older construction buildings. The multi-gang electrical box 10 of the present disclosure overcomes such a shortcoming, amongst other shortcomings, by eliminating the need for such divider members (formations), when installing the multi-gang electrical box 10 used in new construction buildings.

Advantageously, the present disclosure provides an improved multi-gang electrical box 10 for receiving a plurality of electrical devices and wirings. Per current National Electric Contractors Association article 725.136(c) and the National Electrical Installation Standards for new construction, new 120-volt alternating current (AC) wires and new lower volt wires (e.g., 50-volt) can be supported in separate boxes residing in the electrical enclosure 11, without dividers (formations). Such a structural configuration reduces installation time because an electrician does not need to employ dividers (formations) within the electrical enclosure 11 and cover 31. Therefore, the dividers (formations) disclosed in the U.S. Pat. No. 10,278,301 are not needed when installing the electrical enclosure 11 for new construction.

Referring to FIGS. 1-10, the multi-gang electrical box 10 includes an electrical enclosure 11 defining opposed side walls 12, a lower wall 13, an upper wall 14, and a rear wall 15. The rear wall 15 has a perimeter adjoining the side walls 12, the lower wall 13, and the upper wall 14 to form a cavity 16 therebetween. The electrical enclosure 11 has a centrally registered longitudinal axis 22 traversing the lower wall 13 and the upper wall 14. A complementary cover 31 is configured to removably affix to an opening of the cavity 16 of the electrical enclosure 11. Advantageously, a plurality of linear grooves 17 are disposed along an interior surface 18 of the opposed sidewalls, respectively, and spaced from the lower wall 13 and the upper wall 14. A plurality of chamfered channels 19 are disposed at the rear wall 15 for receiving electrical wires therethrough. Advantageously, each of the upper wall 14 and the rear wall 15 has a corresponding entirely smooth, planar, and uninterrupted inner surface 14a, 15a, respectively. Such a structural configuration provides the new, useful, and unexpected result of eliminating the need for dividers (formations) in the multi-gang electrical box 10 installed in new building construction.

In a non-limiting exemplary embodiment, the linear grooves 17 are juxtaposed side-by-side in a parallel configuration, and may define lines of weakness. Advantageously, the linear grooves 17 are suitably sized and shaped for receiving a fastener (screw) therethrough for attaching the electrical enclosure 11 to a wall stud at a new building construction. In this manner, the linear grooves 17 are registered orthogonal to the centrally registered longitudinal axis 22. Such a structural configuration provides the new, useful, and unexpected result of enabling a user to directly affix the multi-gang electrical box 10 to wall studs by penetrating screws directly through the linear grooves 17 and into the wall studs in new building construction while satisfying new building construction codes. The fasteners can be positioned at desired positions along the longitudinal lengths of the linear grooves 17.

In a non-limiting exemplary embodiment, the chamfered channels 19 include a plurality of paired chamfered channels 19a-19d extended through the rear wall 15 and linearly juxtaposed between the opposed side walls 12. For example, four pairs of chamfered channels 19a-19d are disposed along a linear path 21. Such a structural configuration provides the new, useful, and unexpected result of more efficiently guiding groups of new electrical wires into and out of the electrical enclosure 11 per new building construction codes.

In a non-limiting exemplary embodiment, the electrical enclosure 11 further includes a plurality of first guide rails 25 statically disposed along the opposed side walls 12 and equidistantly offset from the centrally registered longitudinal axis 22. Such first guide rails 25 are extended inwardly towards the centrally registered longitudinal axis 22 and registered orthogonal thereto. Such a structural configuration provides the new, useful, and unexpected result of easily aligning, attaching and detaching the complementary cover 31 to the electrical enclosure 11 during new building construction.

In a non-limiting exemplary embodiment, the complementary cover 31 includes an upper surface 32 including opposed lateral edges 33 having a plurality of second guide rails 34 statically disposed thereat and slidably engaged with the first guide rails 25, respectively, along a linear travel path 35 substantially orthogonal to the centrally registered longitudinal axis 22. Such an upper surface 32 further has an entirely smooth, planar, and uninterrupted medial section 32a intermediately disposed between the opposed lateral edges 33 and extended along a major longitudinal length of the upper surface 32. Such a structural configuration provides the new, useful, and unexpected result of easily aligning, attaching and detaching the complementary cover 31 to the electrical enclosure 11 during new building construction, and obviates the need for dividers (formations) as taught in the aforementioned patent hereinabove.

In a non-limiting exemplary embodiment, the electrical enclosure 11 further includes a plurality of first snap-fit clasps 27 statically affixed to the inner surface 20 of the opposed side walls 12 and registered parallel to the centrally registered longitudinal axis 22. Advantageously, the first snap-fit clasps 27 are linear. Such a structural configuration provides the new, useful, and unexpected result of easily aligning, attaching and detaching the complementary cover 31 to the electrical enclosure 11 during new building construction.

In a non-limiting exemplary embodiment, the complementary cover 31 further includes a bottom surface 38 including a plurality of second snap-fit clasps 37 frictionally fit with the first snap-fit clasps 27, respectively, when the complementary cover 31 is installed on the electrical enclosure 11. Such a structural configuration provides the new, useful, and unexpected result of easily aligning, attaching and detaching the complementary cover 31 to the electrical enclosure 11 during new building construction.

In a non-limiting exemplary embodiment, the electrical enclosure 11 further includes a plurality of slots 28 registered orthogonal to the centrally registered longitudinal axis 22. The complementary cover 31 further includes a plurality of locking fingers 39 linearly and removably inserted into the slots 28, respectively. Such a structural configuration provides the new, useful, and unexpected result of easily aligning, attaching and detaching the complementary cover 31 to the electrical enclosure 11 during new building construction.

In a non-limiting exemplary embodiment, the electrical enclosure 11 further includes a first top edge 29 connected to the upper wall 14 and having a plurality of first tabs 41 removably affixed thereto. Each of the first tabs 41 has a corresponding first aperture 42. Notably, the complementary cover 31 further includes a second top edge 30 connected to the upper surface 32 and having a plurality of second tabs 43 removably affixed thereto. Each of the second tabs 43 has a corresponding second aperture 44. Advantageously, each of the first tabs 41 and the second tabs 43 has a perforation 45 that is defined along a line of weakness for respectively separating the first tabs 41 and the second tabs 43 from the electrical enclosure 11 and the complementary cover 31, respectively. Such a structural configuration provides the new, useful, and unexpected result of easily aligning, attaching and detaching the complementary cover 31 to the electrical enclosure 11 during new building construction. In addition, unnecessary tabs 41, 43 can be easily removed to allow proper fit of the multi-gang electrical box 10 in space-limited areas defined between wall studs in new building construction.

In a non-limiting exemplary embodiment, both the electrical enclosure 11 and complementary cover 31 are L-shaped. Preferably, the electrical box 10 is a multiple gang electrical box. Such a structural configuration provides the new, useful, and unexpected result of new building construction while fitting in space-limited areas defined by wall studs in new building construction.

In a non-limiting exemplary embodiment, the electrical box 10 allows new plates/covers and associated screws for closing the electrical enclosure 11. In one embodiment, the electrical box 10 is a double gang electrical box with a space of about twenty-two cubic square inches. In another embodiment, the electrical box 10 is a triple gang electrical box with a space of about fifty-two cubic square inches. In yet another embodiment, the electrical box 10 is a four-gang electrical box with a space of about sixty-eight cubic square inches. In yet another embodiment, the electrical box 10 is a multi-gang electrical box.

In a non-limiting exemplary embodiment, the method of installing the multi-gang electrical box 10 is, disclosed, without forming a new hole in the plaster/wall or placing over the old or existing box. A strategy is determined for placement of wires into the new multi-gang electrical box 10 and the wires are inserted through the channels 19 provided at the rear wall 15 of the electrical box 10. The L-shaped cavity 16 of the electrical box 10 is partially inserted into the hole of the wall. With the cavity 16 of the box partially in the wall, the adjacent wires are fed via the rear wall 15 of the electrical box 10. Then the electrical box 10 is completely placed into the hole of the wall by pushing or rotation the electrical box 10, until the box snugly fits in the hole of the wall. When securing the box 10 to the wall, the electrical devices such as switches, plugs are installed and closed with the complementary cover 31.

In a non-limiting exemplary embodiment, the multi-gang electrical box 10 provides more space to manipulate wires and install about 50% more wires than conventional electrical boxes. The more space and cubic inches of the electrical box 10 allows approximately 50% more wire to be placed and enables the wire to lay flat in the interior and on the exterior part of the box 10 without the need for dividers (formations) for multiple light switches and GFCIs. This gives space to bend wire and the ability to manipulate the wires to keep the devices square, clean, and flush with the plate. Further advantages such as reducing installation time, avoids replacement of plaster and cleaning up, uses a new cover plate and allows installation with standard toolset.

While non-limiting exemplary embodiment(s) has/have been described with respect to certain specific embodiment(s), it will be appreciated that many modifications and changes may be made by those of ordinary skill in the relevant art(s) without departing from the true spirit and scope of the present disclosure. It is intended, therefore, by the appended claims to cover all such modifications and changes that fall within the true spirit and scope of the present disclosure. In particular, with respect to the above description, it is to be realized that the optimum dimensional relationships for the parts of the non-limiting exemplary embodiment(s) may include variations in size, materials, shape, form, function and manner of operation.

The Abstract of the Disclosure is provided to comply with 37 C.F.R. § 1.72(b) and is submitted with the understanding that it will not be used to interpret or limit the scope or meaning of the claims. In addition, in the above Detailed Description, various features may have been grouped together or described in a single embodiment for the purpose of streamlining the disclosure. This disclosure is not to be interpreted as reflecting an intention that the claimed embodiment(s) require more features than are expressly recited in each claim. Rather, as the following claims reflect, inventive subject matter may be directed to less than all of the features of any of the disclosed non-limiting exemplary embodiment(s). Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiment(s) which fall within the true spirit and scope of the present disclosure. Thus, to the maximum extent allowed by law, the scope of the present disclosure is to be determined by the broadest permissible interpretation of the following claims and their equivalents, and shall not be restricted or limited by the above detailed description.

What is claimed as new and what is desired to secure by Letters Patent of the United States is:

1. A multi-gang electrical box for use in new building construction and configured to receive a plurality of electrical devices and wirings, said multi-gang electrical box comprising:
    an electrical enclosure defining opposed side walls, a lower wall, an upper wall, and a rear wall, wherein said rear wall has a perimeter adjoining said side walls, said lower wall, and said upper wall to form a cavity, said electrical enclosure having a centrally registered longitudinal axis traversing said lower wall and said upper wall;
    a complementary cover assembly configured to removably affix to an opening of said cavity of said electrical enclosure;
    a plurality of linear grooves disposed along an interior surface of said opposed sidewalls, respectively; and
    a plurality of chamfered channels disposed at said rear wall for receiving electrical wires therethrough;
    wherein each of said upper wall and said rear wall has a corresponding smooth, planar, and uninterrupted inner surface, respectively.

2. The electrical box of claim 1, wherein said linear grooves are juxtaposed side-by-side in a parallel configuration, wherein said linear grooves are suitably sized and shaped for receiving a fastener therethrough for attaching said electrical enclosure to a wall stud at a new building construction, wherein said linear grooves are registered orthogonal to the centrally registered longitudinal axis.

3. The electrical box of claim 2, wherein said chamfered channels comprise: a plurality of paired chamfered channels extended through said rear wall and linearly juxtaposed between said opposed side walls.

4. The electrical box of claim 3, wherein said electrical enclosure further comprises: a plurality of first guide rails statically disposed along said opposed side walls and equidistantly offset from the centrally registered longitudinal axis, said first guide rails being extended inwardly towards the centrally registered longitudinal axis and registered orthogonal thereto.

5. The electrical box of claim 4, wherein said complementary cover comprises: an upper surface including opposed lateral edges having a plurality of second guide rails statically disposed thereat and slidably engaged with said first guide rails, respectively, along a linear travel path substantially orthogonal to the centrally registered longitudinal axis, wherein said upper surface further has a smooth, planar, and uninterrupted medial section intermediately disposed between said opposed lateral edges.

6. The electrical box of claim 5, wherein said electrical enclosure further comprises: a plurality of first snap-fit clasps statically affixed to said inner surface of said opposed side walls and registered parallel to the centrally registered longitudinal axis, wherein said first snap-fit clasps are linear.

7. The electrical box of claim 6, wherein the complementary cover further comprises: a bottom surface including a plurality of second snap-fit clasps frictionally fit with said first snap-fit clasps, respectively, when said complementary cover is installed on said electrical enclosure.

8. The electrical box of claim 7, wherein said electrical enclosure further comprises: a plurality of slots registered orthogonal to the centrally registered longitudinal axis, said complementary cover further includes a plurality of locking fingers linearly and removably inserted into said slots, respectively.

9. The electrical box of claim 8, wherein said electrical enclosure further comprises: a first top edge connected to said upper wall and having a plurality of first tabs removably affixed thereto, each of said first tabs having a corresponding first aperture;
    wherein said complementary cover further comprises: a second top edge connected to said upper surface and having a plurality of second tabs removably affixed thereto, each of said second tabs having a corresponding second aperture;
    wherein each of said first tabs and said second tabs has a perforation that is defined along a line of weakness for respectively separating said first tabs and said second tabs from said electrical enclosure and said complementary cover.

10. The electrical box of claim 9, wherein each of said cavity of said electrical enclosure is L-shaped, wherein said electrical box is a multiple gang electrical box.

11. A multi-gang electrical box for use in new building construction and configured to receive a plurality of electrical devices and wirings, said multi-gang electrical box comprising:
    an electrical enclosure defining opposed side walls, a lower wall, an upper wall, and a rear wall, wherein said rear wall has a perimeter adjoining said side walls, said lower wall, and said upper wall to form a cavity, said electrical enclosure having a centrally registered longitudinal axis traversing said lower wall and said upper wall;
    a complementary cover assembly configured to removably affix to an opening of said cavity of said electrical enclosure;

a plurality of linear grooves disposed along an interior surface of said opposed sidewalls, respectively, and spaced from said lower wall and said upper wall; and a plurality of chamfered channels disposed at said rear wall for receiving electrical wires therethrough;

wherein each of said upper wall and said rear wall has a corresponding smooth, planar, and uninterrupted inner surface, respectively.

12. The electrical box of claim 11, wherein said linear grooves are juxtaposed side-by-side in a parallel configuration, wherein said linear grooves are suitably sized and shaped for receiving a fastener therethrough for attaching said electrical enclosure to a wall stud at a new building construction, wherein said linear grooves are registered orthogonal to the centrally registered longitudinal axis.

13. The electrical box of claim 12, wherein said chamfered channels comprise: a plurality of paired chamfered channels extended through said rear wall and linearly juxtaposed between said opposed side walls.

14. The electrical box of claim 13, wherein said electrical enclosure further comprises: a plurality of first guide rails statically disposed along said opposed side walls and equidistantly offset from the centrally registered longitudinal axis, said first guide rails being extended inwardly towards the centrally registered longitudinal axis and registered orthogonal thereto.

15. The electrical box of claim 14, wherein said complementary cover comprises: an upper surface including opposed lateral edges having a plurality of second guide rails statically disposed thereat and slidably engaged with said first guide rails, respectively, along a linear travel path substantially orthogonal to the centrally registered longitudinal axis, wherein said upper surface further has a smooth, planar, and uninterrupted medial section intermediately disposed between said opposed lateral edges.

16. The electrical box of claim 15, wherein said electrical enclosure further comprises: a plurality of first snap-fit clasps statically affixed to said inner surface of said opposed side walls and registered parallel to the centrally registered longitudinal axis, wherein said first snap-fit clasps are linear.

17. The electrical box of claim 16, wherein the complementary cover further comprises: a bottom surface including a plurality of second snap-fit clasps frictionally fit with said first snap-fit clasps, respectively, when said complementary cover is installed on said electrical enclosure.

18. The electrical box of claim 17, wherein said electrical enclosure further comprises: a plurality of slots registered orthogonal to the centrally registered longitudinal axis, said complementary cover further includes a plurality of locking fingers linearly and removably inserted into said slots, respectively.

19. The electrical box of claim 18, wherein said electrical enclosure further comprises: a first top edge connected to said upper wall and having a plurality of first tabs removably affixed thereto, each of said first tabs having a corresponding first aperture;

wherein said complementary cover further comprises: a second top edge connected to said upper surface and having a plurality of second tabs removably affixed thereto, each of said second tabs having a corresponding second aperture;

wherein each of said first tabs and said second tabs has a perforation that is defined along a line of weakness for respectively separating said first tabs and said second tabs from said electrical enclosure and said complementary cover.

20. The electrical box of claim 19, wherein each of said cavity of said electrical enclosure is L-shaped, wherein said electrical box is a multiple gang electrical box.

* * * * *